(12) United States Patent
Elliott et al.

(10) Patent No.: US 9,899,965 B2
(45) Date of Patent: Feb. 20, 2018

(54) DIFFERENTIAL AMPLIFIERS WITH IMPROVED SLEW PERFORMANCE

(71) Applicant: ANALOG DEVICES, INC., Norwood, MA (US)

(72) Inventors: Michael R. Elliott, Summerfield, NC (US); Joseph M. Hensley, Lexington, NC (US)

(73) Assignee: ANALOG DEVICES, INC., Norwood, MA (US)

( * ) Notice: Subject to any disclaimer, the term of this patent is extended or adjusted under 35 U.S.C. 154(b) by 29 days.

(21) Appl. No.: 14/864,182

(22) Filed: Sep. 24, 2015

(65) Prior Publication Data

US 2017/0093349 A1    Mar. 30, 2017

(51) Int. Cl.
*H03F 3/45* (2006.01)
*H03F 1/32* (2006.01)
*H03F 1/02* (2006.01)

(52) U.S. Cl.
CPC ......... *H03F 1/3211* (2013.01); *H03F 1/0233* (2013.01); *H03F 3/45237* (2013.01); *H03F 2200/18* (2013.01); *H03F 2200/408* (2013.01); *H03F 2200/456* (2013.01); *H03F 2203/45248* (2013.01)

(58) Field of Classification Search
CPC .. H03F 1/3211; H03F 1/0233; H03F 3/45237; H03F 2200/18; H03F 2200/408; H03F 2200/456; H03F 2203/45248; H03F 3/45139; H03F 3/45336; H03F 3/45434
USPC ....... 330/252, 253, 259, 257, 260, 261, 288, 330/290, 310
See application file for complete search history.

(56) References Cited

U.S. PATENT DOCUMENTS

| 8,643,527 | B2 | 2/2014 | Kosic | |
| 2012/0307122 | A1* | 12/2012 | Liu | G05F 1/56 348/332 |
| 2013/0099863 | A1* | 4/2013 | Parkhurst | H03F 3/45183 330/253 |
| 2013/0154863 | A1* | 6/2013 | Ho | H03F 3/265 341/143 |

OTHER PUBLICATIONS

Taghizadeh et al., "A Modified Approach for CMOS Auto-Zeroed Offset-Stabilized Opamp", Circuits and Systems, 2013, 4, 193-201, Scientific Research.*
Stacy Ho, "A Pipelined Converter (AD876)", Analog Dialogue, retrieved from: http://www.analog.com/library/analogDialogue/architeves/29-2/pipelined.html [Aug. 20, 2015], 2 pages.
(Continued)

*Primary Examiner* — Steven J Mottola
*Assistant Examiner* — Hafizur Rahman
(74) *Attorney, Agent, or Firm* — Patent Capital Group

(57) ABSTRACT

Disclosed herein are differential amplifiers for improved slew performance. In some embodiments, a differential amplifier may receive positive and negative input signals at first and second transistor branches, respectively; provide a dynamic bias current to the first and second transistor branches, responsive to the positive and negative input signals; and provide positive and negative output signals at the second and first transistor branches, respectively.

20 Claims, 6 Drawing Sheets

(56) References Cited

OTHER PUBLICATIONS

Wikipedia, "Current Mirror", retrieved from: http://en.widipedial.org/wiki/Current_Mirror [Sep. 16, 2015], 9 pages.
R. Jacob Baker et al., "High Speed Op-amp Design: Compensation and Topologies for Two and Three Stage Designs", Boise State University, retrieved from http://cmosedu.com/jbaker/papers/talks/Multistage_Opamp_Presentation.pdf [Sep. 24, 2015], 58 pages.
Eric Newman et al., "A Resonant Approach to Interfacing Amplifiers to Switched-Capacitor ADCs", Analog Devices, AN-827 Application Note, www.analog.com, retrieved from http://www.analog.com/media/en/technical-documentation/application-notes/57768582105746945770557885340438157489253519118934 09-57AN_827_0.pdf [Sep. 24, 2015], 8 pages.

* cited by examiner

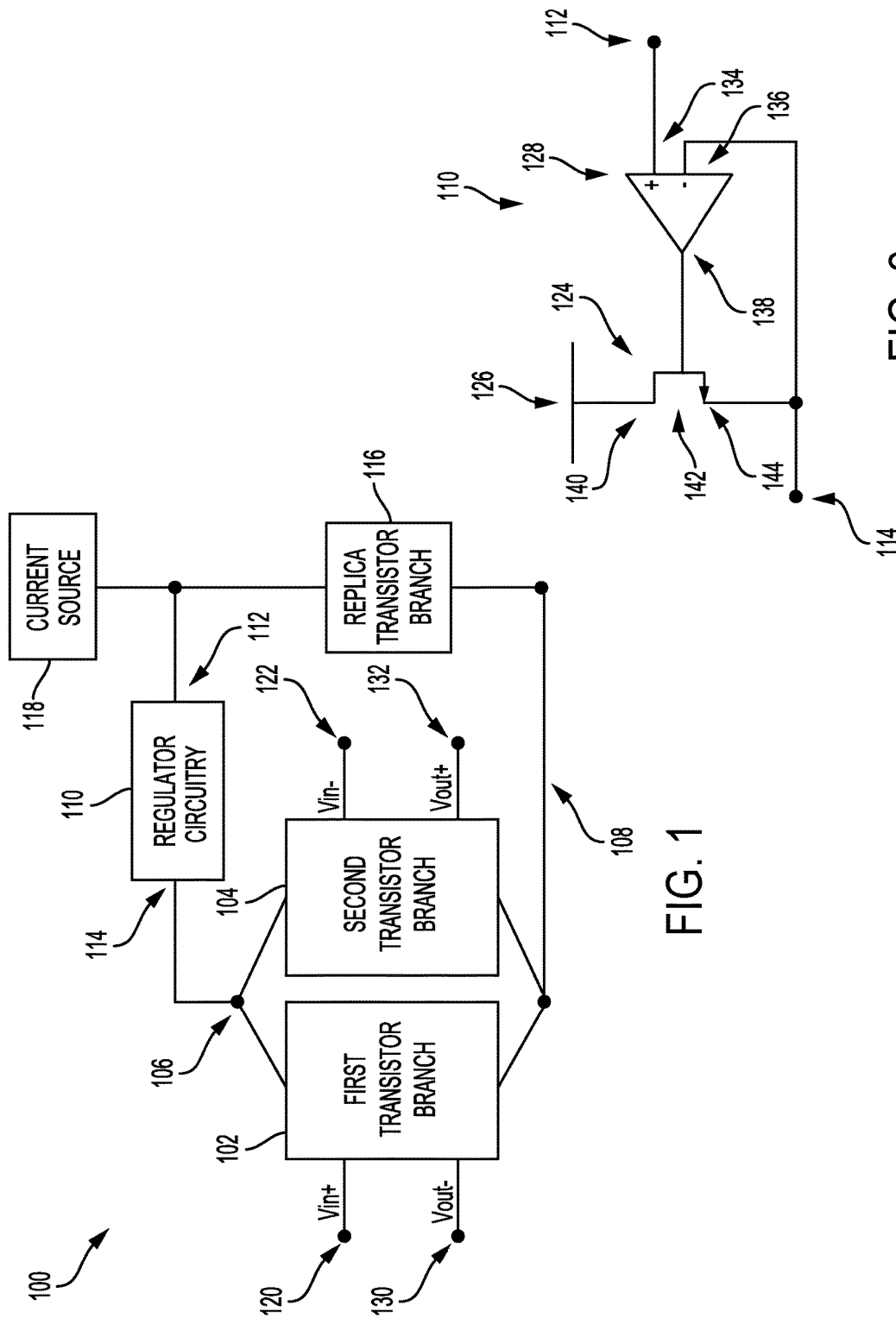

DIFFERENTIAL AMPLIFIERS WITH IMPROVED SLEW PERFORMANCE

TECHNICAL FIELD

This disclosure relates generally to electronic amplifiers, and more particularly, to differential amplifiers with improved slew performance.

BACKGROUND

Slew limiting may occur in an electronic amplifier when the output of the amplifier reaches its maximum rate of voltage change per unit of time (the "slew rate"). When the frequency content of the input to the amplifier exceeds the slew rate, the amplifier's output will be a nonlinear function of the input. Such nonlinearity is typically undesirable in amplifier applications.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 1 is a block diagram of a differential amplifier, in accordance with various embodiments.

FIG. 2 is a schematic illustration of an embodiment of regulator circuitry that may be included in the differential amplifier of FIG. 1.

DETAILED DESCRIPTION

Figure 3:
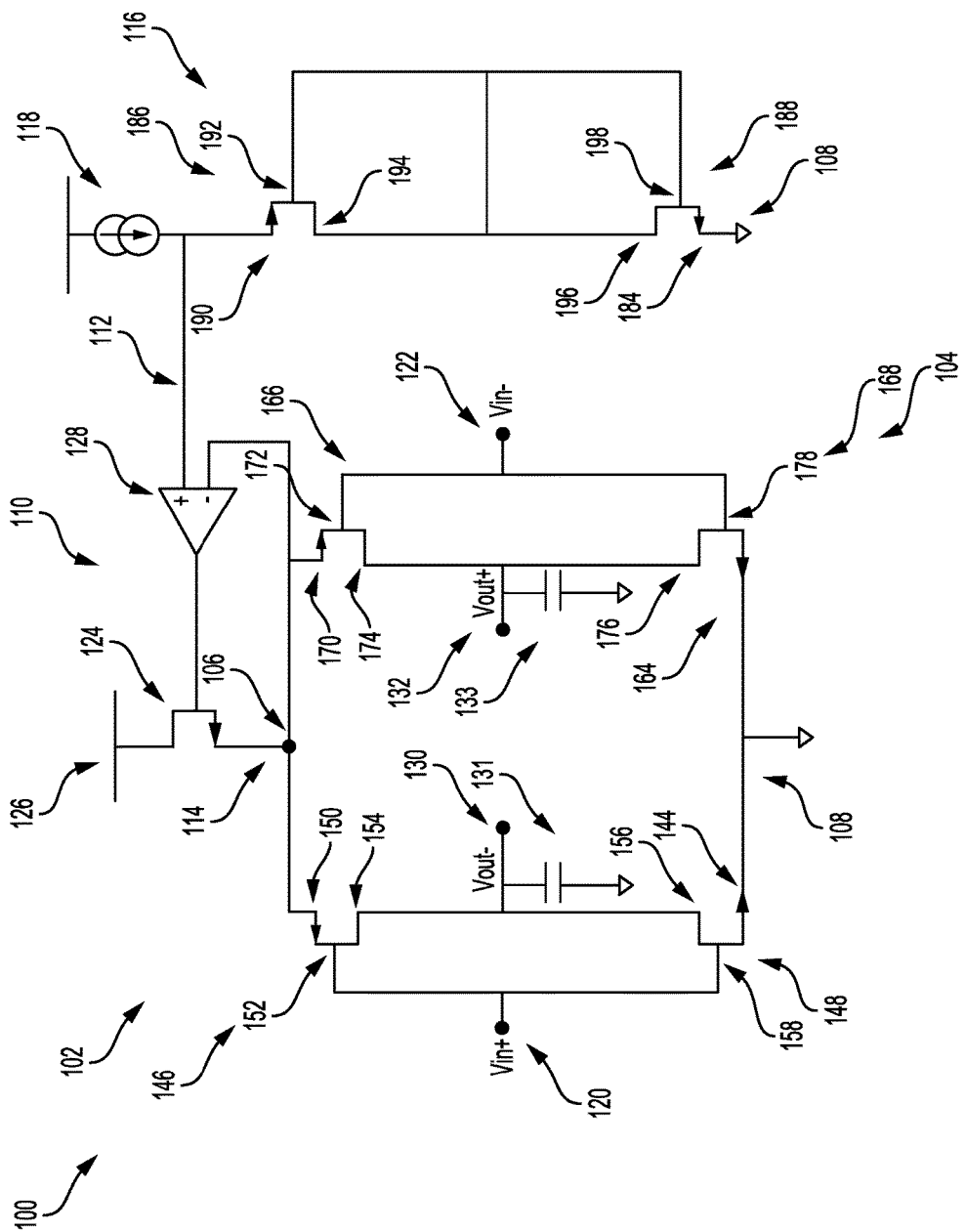
FIG. 3 is a schematic illustration of an embodiment of the differential amplifier of FIG. 1 including the regulator circuitry of FIG. 2.

Disclosed herein are single- and multistage amplifiers for improved slew performance. Various ones of the amplifiers disclosed herein may be particularly suitable for low-voltage, high-linearity applications. Such applications may include, for example, pipeline and/or switched capacitor analog to digital converters (ADCs).

In order to achieve design objectives around voltage headroom, gain, speed, and other performance criteria, some differential amplifier topologies will exhibit so much transconductance that a slew problem arises. In particular, when a step or other high-frequency input is applied, the output of the differential amplifier may "tilt," with all the supply current flowing to the positive or negative terminal. A differential amplifier prone to tilt may exhibit non-exponential settling and poor small signal behavior. A traditional approach to reducing slewing is to increase the available supply current. However, for low-power applications, increasing the supply current may be impossible and/or undesirable.

The differential amplifiers disclosed herein may achieve improved slew performance relative to conventional designs, and various embodiments may be particularly suitable for low power applications. Many examples of such differential amplifiers, and related circuits and methods, are discussed in detail below.

In the following detailed description, reference is made to the accompanying drawings, which form a part hereof wherein like numerals designate like parts throughout. The drawings illustrate various embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous.

FIG. 1 is a block diagram of a differential amplifier 100, in accordance with various embodiments. The differential amplifier 100 includes a first transistor branch 102 and a second transistor branch 104 arranged in parallel and coupled between a first node 106 and a second node 108. A positive input terminal 120 of the differential amplifier 100 may be coupled to the first transistor branch 102 and a negative input terminal 122 of the differential amplifier 100 may be coupled to the second transistor branch 104. A positive output terminal 132 of the differential amplifier 100 may be coupled to the second transistor branch 104, and a negative output terminal 130 of the differential amplifier 100 may be coupled to the first transistor branch 102. A differential voltage received across the positive input terminal 120 and the negative input terminal 122 may be amplified by the differential amplifier 100 to provide a differential voltage across the positive output terminal 132 and the negative output terminal 130.

The differential amplifier 100 may include a regulator circuitry 110, which may include a regulator input 112 and a regulator output 114. The regular output 114 may be coupled to the first node 106. The regulator circuitry 110 may be configured to receive a reference voltage value at the regulator input 112 and to maintain the reference voltage value at the regulator output 114. Various examples of circuits that may provide the regulator circuitry 110 are discussed in further detail below.

The differential amplifier 100 may also include a replica transistor branch 116. The replica transistor branch 116 may be coupled between the regulator input 112 and the second node 108 and may include an arrangement of transistors that replicates an arrangement of transistors in the first transistor branch 102. As used herein, a first arrangement of transistors "replicates" a second arrangement of transistors when the second arrangement of transistors is identical to the first arrangement of transistors from the perspectives of an identified input terminal and an identified output terminal. In embodiments where the first transistor branch 102 and the second transistor branch 104 have the same arrangement of transistors, the replica transistor branch 116 may replicate the arrangement of transistors in both the first transistor branch 102 and the second transistor branch 104.

The differential amplifier 100 may also include a current source 118. The current source 118 may be coupled to the regulator input 112 and may provide current to the regulator circuitry 110, the first transistor branch 102, the second transistor branch 104, and the replica transistor branch 116.

The current source 118, the regulator circuitry 110, and the replica transistor branch 116 may provide bias circuitry that enables strong amplifier performance with a comparatively low bias current. In particular, the current source 118 may provide current to the replica transistor branch 116 to achieve a fixed reference voltage value at the regulator input 112. The regulator circuitry 110 may maintain this reference voltage value at the regulator output 114, and the current source 118 (and any other suitable voltage and current supplies included in the differential amplifier 100) may source current to the first transistor branch 102 and the second transistor branch 104 to maintain the reference voltage value at the regular output 114. This may allow the first transistor branch 102 and the second transistor branch 104 to operate at voltages greater than a nominal supply voltage for the differential amplifier 100, and to dynamically source current through the first transistor branch 102 and the second transistor branch 104 in response to changes in a differential input signal. Additional examples of the operation of various embodiments of the differential amplifier 100 are discussed in detail below.

The regulator circuitry 110 may take any of a number of forms. FIG. 2 is a schematic illustration of an embodiment of the regulator circuitry 110 that may be included in the differential amplifier 100 of FIG. 1. In the embodiment of FIG. 2, the regulator circuitry 110 may include a supply transistor 124 coupled between a supply voltage 126 and the regulator output 114. In particular, FIG. 2 illustrates an embodiment in which a drain 140 of the supply transistor 124 is coupled to the supply voltage 126, and a source 144 of the supply transistor 124 is coupled to the regulator output 114.

The regular circuitry 110 of the embodiment of FIG. 2 may also include an operational amplifier (op amp) 128. The op amp 128 may have a first input 134, a second input 136, and an output 138. In some embodiments, the first input 134 may be a non-inverting input to the op amp 128 and the second input 136 may be an inverting input to the op amp 128, as illustrated in FIG. 2. The output 138 of the op amp 128 may be coupled to a gate 142 of the supply transistor 124. The first input 134 may be coupled to the regulator input 112, and a second input 136 may be coupled to the regulator output 114.

The regulator circuitry 110 of the embodiment of FIG. 2 may be configured to receive the reference voltage value at the regulator input 112 and maintain the reference voltage value at the regulator output 114. In particular, the op amp 128, upon receiving the reference voltage value at the first input 134 from the regulator input 112, will draw power from its own supply (not shown) to attempt to minimize the voltage difference between the first input 134 and the second input 136. Thus, the voltage that appears at the regulator output 114 (coupled to the second input 136) may be substantially the same as the reference voltage value at the regulator input 112 (coupled to the first input 134).

The components of the differential amplifier 100 may take any of a number of forms. FIG. 3 is a schematic illustration of an embodiment of the differential amplifier 100 of FIG. 1 including the regulator circuitry 110 of FIG. 2. In particular, the regulator circuitry 110 included in the differential amplifier 100 of FIG. 3 may include the supply transistor 124 and the op amp 128, arranged as discussed above with reference to FIG. 2 and configured to receive a reference voltage value at the regulator input 112 and maintain the reference voltage value at the regulator output 114, coupled to the first node 106. The differential amplifier 100 of FIG. 3 includes the first transistor branch 102 and the second transistor branch 104 coupled in parallel between the first node 106 and a second node 108. In the embodiment of FIG. 3, the second node 108 is coupled to ground. The differential amplifier 100 of FIG. 3 also includes the replica transistor branch 116 coupled between the regulator input 112 and the second node 108. The current source 118 is coupled to the regulator input 112.

In the embodiment of FIG. 3, the first transistor branch 102 and the second transistor branch 104 include identical arrangements of transistors. The first transistor branch 102 includes a p-type metal oxide semiconductor (PMOS) transistor 146 and an n-type metal oxide semiconductor (NMOS) transistor 148. A gate 152 of the PMOS transistor 146 is coupled to a gate 158 of the NMOS transistor 148. The gate 152 of the PMOS transistor 146 and the gate 158 of the NMOS transistor 148 are coupled to the positive input terminal 120 of the differential amplifier 100. A drain 154 of the PMOS transistor 146 is coupled to a drain 156 of the NMOS transistor 148. The drain 154 of the PMOS transistor 146 and the drain 156 of the NMOS transistor 148 are coupled to the negative output terminal 130 of the differential amplifier 100. A source 150 of the PMOS transistor 146 is coupled to the first node 106, and the source 144 of the NMOS transistor 148 is coupled to the second node 108. A loading capacitor 131 may be coupled between the negative output terminal 130 and the reference voltage 108.

The second transistor branch 104 in the embodiment of FIG. 3 is arranged analogously to the first transistor branch 102. In particular, a PMOS transistor 166 and an NMOS transistor 168 are arranged such that a gate 172 of the PMOS transistor 166 is coupled to a gate 178 of the NMOS transistor 168, a drain 174 of the PMOS transistor 166 is coupled to a drain 176 of the NMOS transistor 168, a source 170 of the PMOS transistor 166 is coupled to the first node 106, and a source 164 of the NMOS transistor 168 is coupled to the second node 108. The gate 172 of the PMOS transistor 166 and the gate 178 of the NMOS transistor 168 are coupled to the negative input terminal 122 of the differential amplifier 100. The drain 174 of the PMOS transistor 166 and the drain 176 of the NMOS transistor 168 are coupled to the positive output terminal 132 of the differential amplifier 100. A loading capacitor 133 may be coupled between the positive output terminal 132 and the reference voltage 108.

Figure 5:
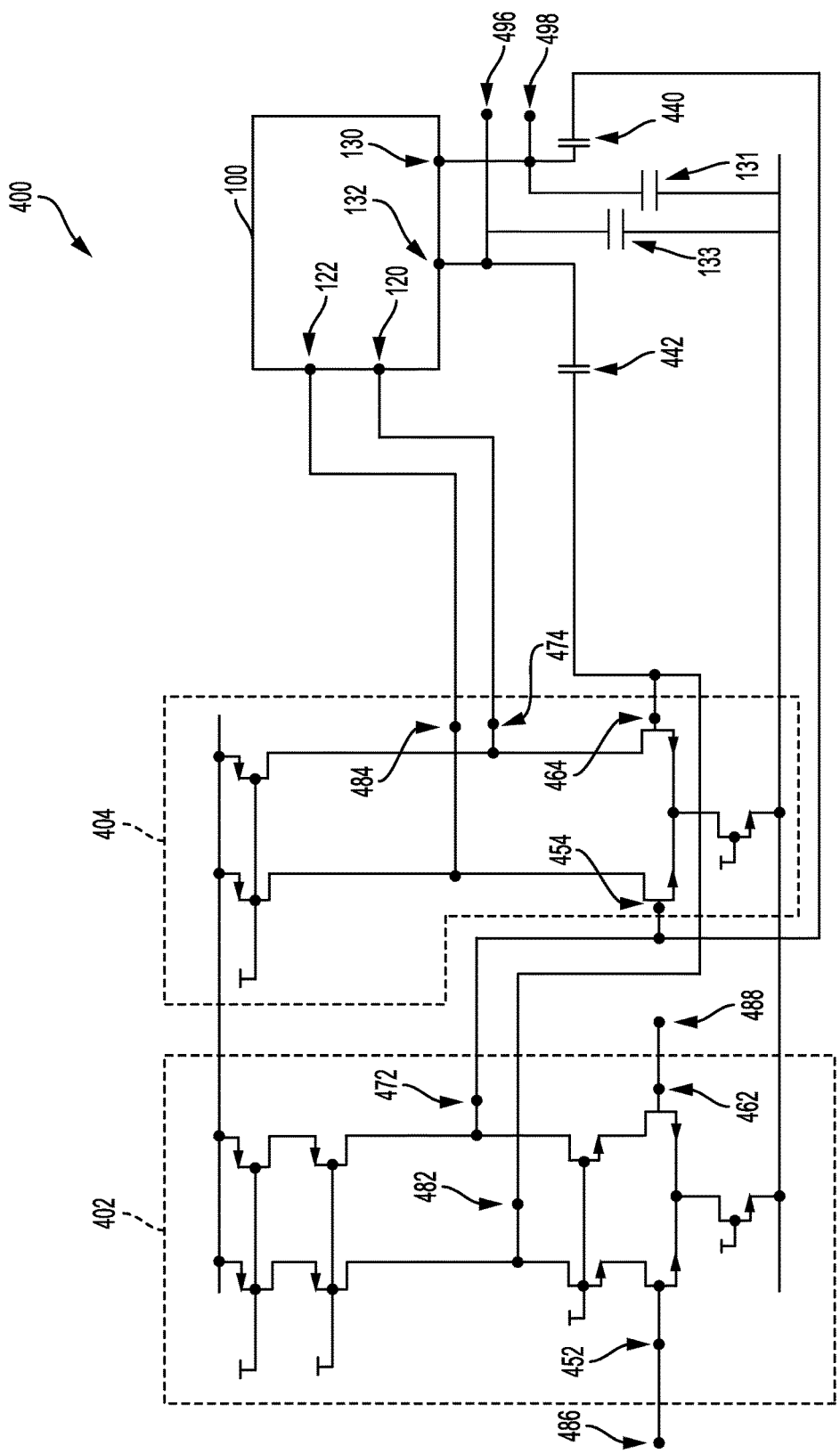
FIG. 5 is a schematic illustration of an embodiment of the multistage amplifier of FIG. 4.

The first transistor branch 102 and the second transistor branch 104 may form a push-pull amplifier architecture. This structure may be distinguished from traditional differential pair architectures, in which (with reference to the first transistor branch 102) the gates 152 and 158 of the transistors 146 and 148, respectively, are tied to a bias voltage (e.g., the supply voltage 126), instead of the positive input terminal 120. An example of such a traditional differential pair architecture is illustrated in FIG. 5 for a second stage 404 of a multistage amplifier 400.

The arrangement of transistors in the replica transistor branch 116 replicates the arrangement of transistors in the first transistor branch 102 (and the second transistor branch 104). In particular, the replica transistor branch 116 includes a PMOS transistor 186 and an NMOS transistor 188 arranged such that a gate 192 of the PMOS transistor 186 is coupled to a gate 198 of the NMOS transistor 188, and a drain 194 of the PMOS transistor 186 is coupled to a drain 196 of the NMOS transistor 188. In the first transistor branch 102, the gate 152 of the PMOS transistor 146 is coupled to the positive input terminal 120 and the drain 154 of the PMOS transistor 146 is coupled to the negative output terminal 130; in the replica transistor branch 116, the gate 192 of the PMOS transistor 186 and the drain 194 of the PMOS transistor 186 are coupled together. Thus, the replica transistor branch 116 may provide an "equivalent" of the first transistor branch 102 with the terminals 120 and 130 short-circuited. A source 190 of the PMOS transistor 186 is coupled to the regulator input 112, and a source 184 of the NMOS transistor 188 is coupled to the second node 108.

The first transistor branch 102 may be regarded as having a particular arrangement of transistors between an identified input terminal and an identified output terminal. In the embodiment of FIG. 3, the identified input terminal for the first transistor branch 102 may be the positive input terminal 120, and the identified output terminal may be the negative output terminal 130. The second transistor branch 104 may be regarded as having the same particular arrangement of transistors between the identified input terminal and the identified output terminal. In the embodiment of FIG. 3, the identified input terminal for the second transistor branch 104 may be the negative input terminal 122, and the identified output terminal may be the positive output terminal 132. The replica transistor branch 116 may be regarded as having the particular arrangement of transistors between the identified input terminal and the identified output terminal, with the identified input terminal and the identified output terminal coupled together.

The arrangement of transistors in the first transistor branch 102, the second transistor branch 104, and the replica transistor branch 116 is simply illustrative, and any suitable transistor arrangement that provides an amplification of a differential input signal, in accordance with the remaining structure of the differential amplifier 100, may be used.

FIG. 3 also illustrates the supply voltage 126 coupled to the supply transistor 124 (as discussed above with reference to FIG. 2), and the current source 118 coupled to the regulator input 112 and the replica transistor branch 116.

In use, the current source 118 may supply current to the replica transistor branch 116 to bias the PMOS transistor 186 and the NMOS transistor 188 so that the voltage at the regulator input 112 is the sum of the gate-source voltage of the PMOS transistor 186 and the gate-source voltage of the NMOS transistor 188. When the PMOS transistor 186 and the NMOS transistor 188 are well matched, and the gate-source voltages can both be represented as Vgs, the voltage at the regulator input 112 will be 2 Vgs. The regulator circuitry 110, as discussed above, may maintain the regulator output 114 at the voltage 2 Vgs. In some embodiments, the voltage 2 Vgs may have a value of 1.2 volts or greater, and depending upon the value of the supply voltage 126, may exceed the value of the supply voltage 126. The op amp 128 may servo the supply transistor 124 so that the voltage at the regulator output 114 is equal to the voltage at the regulator input 112. The charge stored in the load capacitors 131 and 133 can be quickly discharged to achieve an exponential response to changes in the input. In operation, the transistor branches 102 and 104 of the embodiment of FIG. 3 allow for an effectively "unlimited" current drive in both directions, avoiding "tilt" and reducing slew, without incurring a significant power cost. The differential amplifier 100 is capable of creating its own dynamic current to allow exponential settling (instead of linear, slew-limiting settling).

The value of the supply voltage 126 may take any suitable value (e.g., based on the process technology used). In some embodiments, the supply voltage 126 may have a value of 1.2 volts. In lower supply process topologies such as 28 nm and beyond, the supply voltage 126 may be 900 mV. In higher supply process technologies, such as 180 nm, however, embodiments of the differential amplifier 100 may be used, but embodiments in which the differential amplifier 100 is used in a three-stage amplifier may be difficult to keep stable given the device delays and large gains.

Figure 4:
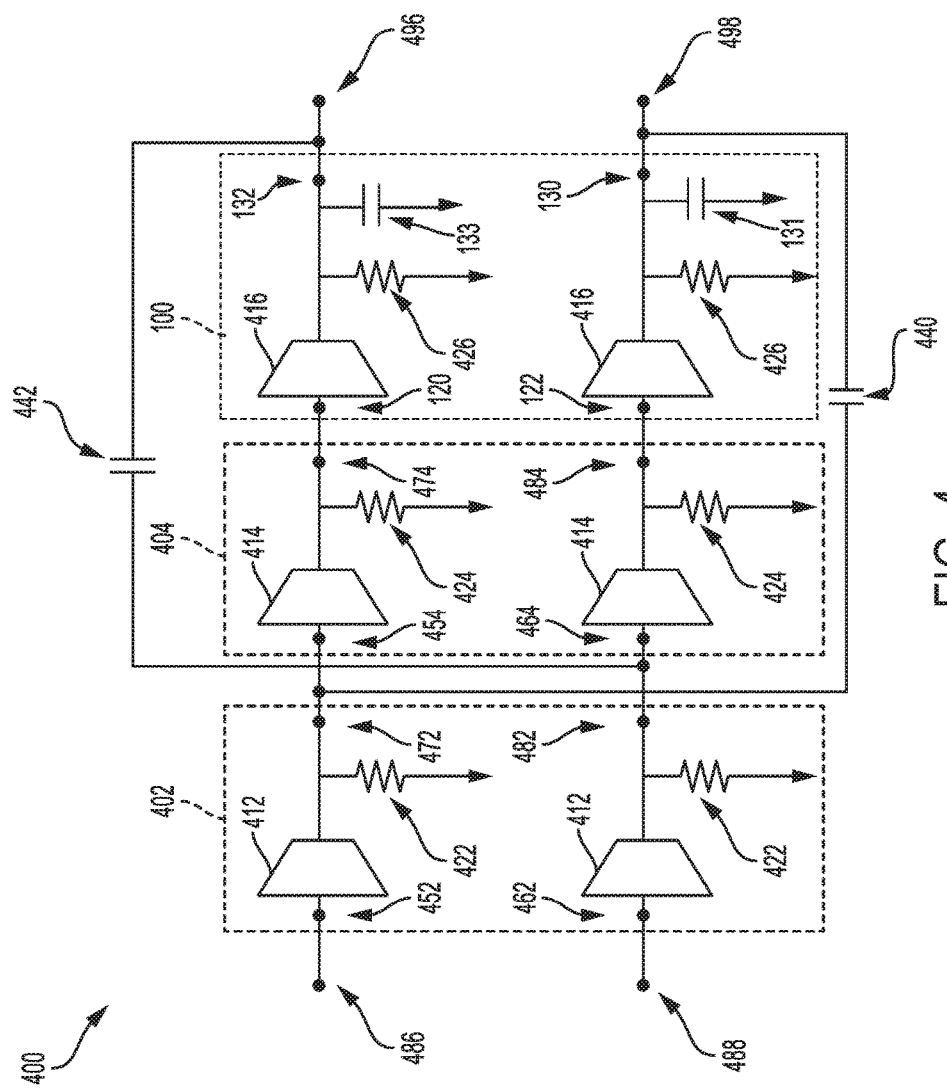
FIG. 4 is a representation of a multistage amplifier including the differential amplifier of FIG. 1, in accordance with various embodiments.

In some embodiments, the differential amplifier 100 may be used as an output stage of a multistage amplifier. For example, FIG. 4 is a representation of the multistage amplifier 400 including the differential amplifier 100 of FIG. 1, in accordance with various embodiments. The multistage amplifier 400 includes a positive input terminal 486, a negative input terminal 488, a positive output terminal 496, and a negative output terminal 498. The multistage amplifier 400 of FIG. 4 is a three-stage amplifier, with each stage represented by its equivalent gain and its equivalent parallel resistance. In the embodiment of FIG. 4, the gain that each stage applies to a "positive" portion of the differential input signal, and the resistance experienced by the "positive" portion of the differential input signal, is the same as the gain and resistance experienced by a "negative" portion of the differential input signal, as shown. Although three stages of amplification are illustrated in FIG. 4, any suitable number of stages may be used.

A first stage 402 may include a positive input terminal 452, a negative input terminal 462, a positive output terminal 472, and a negative output terminal 482. The first stage 402 includes a gain 412 and a resistance 422, as illustrated. The second stage 404 may include a positive input terminal 454, a negative input terminal 464, a positive output terminal 474, and a negative output terminal 484. The second stage 404 includes a gain 414 and a resistance 424, as illustrated. The third stage of the multistage amplifier 400 may be the differential amplifier 100, with its positive input terminal 120, negative input terminal 122, positive output terminal 132, negative output terminal 130, and loading capacitors 131 and 133. The equivalent gain and resistance experienced by a differential signal input to the differential amplifier 100 are illustrated as a gain 416 and a resistance 426, respectively. In some embodiments, the gain 412 and/or the gain 414 may be unity.

In the embodiment of FIG. 4, the positive input terminal 452 of the first stage 402 is coupled to the positive input terminal 486 of the multistage amplifier 400, and the negative input terminal 462 of the first stage 402 is coupled to the negative input terminal 488 of the multistage amplifier 400. The positive output terminal 472 of the first stage 402 is coupled to the positive input terminal 454 of the second stage 404. The negative output terminal 482 of the first stage 402 is coupled to the negative input terminal 464 of the second stage 404. The positive output terminal 474 of the second stage 404 is coupled to the positive input terminal 120 of the differential amplifier 100, and the negative output terminal 484 of the second stage 404 is coupled to the negative input terminal 122 of the differential amplifier 100. The positive output terminal 132 of the differential amplifier 100 may be coupled to the positive output terminal 496 of the multistage amplifier 400, and the negative output terminal 130 of the differential amplifier 100 may be coupled to the negative output terminal 498 of the multistage amplifier 400.

In some embodiments, the multistage amplifier 400 may include a compensation capacitor 442 coupled to the positive output terminal 496 and "wrapped back around" to couple to the negative input terminal 464 of the second stage 404, and an analogous compensation capacitor 440 coupled to the negative output terminal 498 and "wrapped back around" to couple to the positive input terminal 454 of the second stage 404. In other embodiments, the multistage amplifier 400 may not include the compensation capacitors 440 and 442, or the compensation capacitors 440 and 442 may be arranged in different ways (e.g., as discussed below with reference to the embodiment of FIG. 5).

The components of the multistage amplifier 400 of FIG. 4 may take any of a number of forms. For example, FIG. 5 is a schematic illustration of an embodiment of the multistage amplifier 400 of FIG. 4. In the embodiment of FIG. 5, the positive input terminal 452 of the first stage 402 is coupled to the positive input terminal 486 of the multistage amplifier 400, and the negative input terminal 462 of the first stage 402 is coupled to the negative input terminal 488 of the multistage amplifier 400. The positive output terminal 472 of the first stage 402 is coupled to the positive input terminal 454 of the second stage 404. The negative output terminal 482 of the first stage 402 is coupled to the negative input terminal 464 of the second stage 404. The positive output terminal 474 of the second stage 404 is coupled to the positive input terminal 120 of the differential amplifier 100, and the negative output terminal 484 of the second stage 404 is coupled to the negative input terminal 122 of the differential amplifier 100. The positive output terminal 132 of the differential amplifier 100 may be coupled to the positive output terminal 496 of the multistage amplifier 400, and the negative output terminal 130 of the differential amplifier 100 may be coupled to the negative output terminal 498 of the multistage amplifier 400. Load capacitors 131 and 133 may be coupled to the negative output terminal 130 and the positive output terminal 131, respectively.

The first stage 402 of the embodiment of FIG. 5 may have a cascode configuration of transistors, exhibiting an open loop gain that is approximated by $(gm*ro)^2$, where gm is the incremental transconductance of a transistor in the first stage 402 and ro is the output resistance of an NMOS transistor in the first stage 402. In some embodiments, the first stage 402 may not have a cascode configuration and may instead take the form of the second stage 404 of the embodiment of FIG. 5, as discussed below. In some embodiments, the first stage 402 may have a different cascode configuration than that illustrated in FIG. 5, such as an active cascode configuration (with op amps "wrapped" around the cascode transistors). However, an active cascode configuration for the first stage 402 may introduce noise and parasitic poles (undesirable for good transient-settling performance) to the multistage amplifier 400.

The second stage 404 of the embodiment of FIG. 5 may have a (non-cascode) differential amplifier arrangement shown. This arrangement may exhibit an open-loop gain that is approximated by $(gm*ro)$, and the multistage combination of the first stage 402 and the second stage 404 may have a combined open-loop gain that is approximated by $(gm*ro)^3$.

The contribution of a differential amplifier 100 (as the third stage of the multistage amplifier 400) is to provide a further gain increase of approximately $(2*gm*ro)$, and thus the multistage amplifier 400 of FIG. 5 may have a combined open-loop gain that is approximated by $2*(gm*ro)^4$. In some applications, the reduction in bias current for the multistage amplifier 400 relative to amplifier configurations that do not include the differential amplifier 100 is at least a factor of 4.

In the embodiment of FIG. 5, the multistage amplifier 400 may include the compensation capacitor 442 coupled to the positive output terminal 496 and "wrapped back around" to couple to the negative input terminal 464 of the second stage 404, and the analogous compensation capacitor 440 coupled to the negative output terminal 498 and "wrapped back around" to couple to the positive input terminal 454 of the second stage 404.

In one embodiment of the multistage amplifier 400, the compensation capacitors 440 and 442 may not be arranged as illustrated in FIG. 5. Instead, the compensation capacitor 442 may be coupled between the positive output terminal 496 and the negative output terminal 484 of the second stage 404 (rather than the negative input terminal 464, as illustrated in FIG. 5). Analogously, the compensation capacitor 440 may be coupled between the negative output terminal 498 and the positive output terminal 474 of the second stage 404 (rather than the positive input terminal 454, as illustrated in FIG. 5).

The multistage amplifier 400 of FIG. 5 may provide a number of advantages over traditional amplifier topologies. While the advance of complementary metal oxide semiconductor (CMOS) process technology to finer geometries has meant that high-speed analog circuit implementations of digital circuits may be realized, designers have been traditionally limited by the voltage headroom required for such devices and/or the low achievable gains. The consequences of such limitations in the design of feedback amplifiers, for example, is a limit on the attainable open-loop gain, which in turn impacts the DC accuracy in the achievable linearity. A traditional approach to these limitations is to operate the analog circuits at a higher supply voltage to accommodate the headroom requirement and to achieve increased gain. However, operating a circuit at a higher supply voltage may increase the power consumption of the circuit. Additionally, the circuit may need to be designed with additional complexity to adequately handle overvoltage issues, increasing the cost and the number of potential failure points in the circuit. Another traditional approach to these limitations is to arrange transistors in a passive cascode configuration to increase their open-loop gain. However, this increase in the open-loop gain comes at the expense of additional headroom. Moreover, at fine CMOS geometries (e.g., less than 180 nm), even this increase in the open loop gain is not sufficient for adequate amplifier performance.

Figure 6:
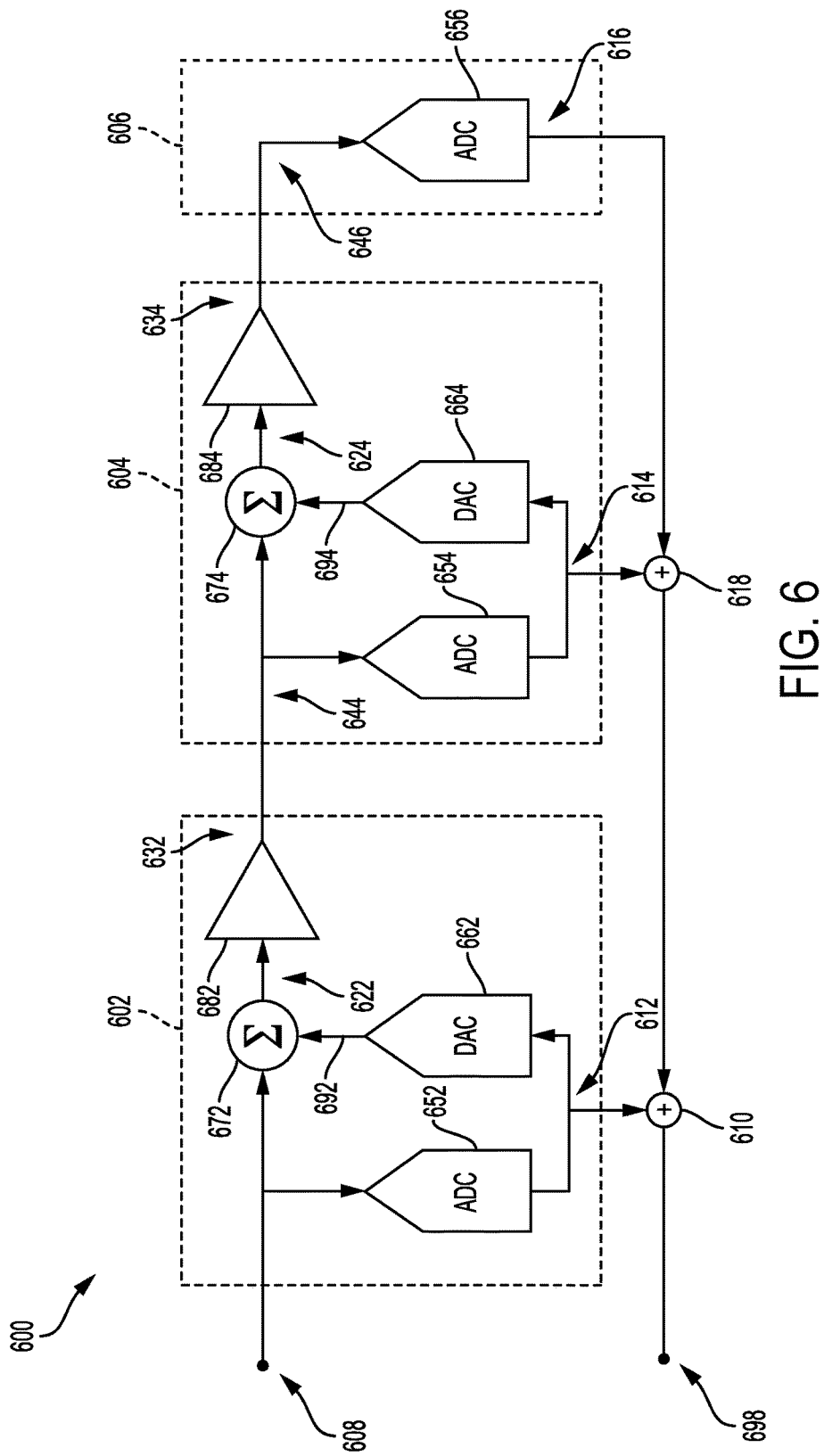
FIG. 6 is a schematic illustration of a pipeline analog to digital converter (ADC) that may include the differential amplifier of FIG. 1, in accordance with various embodiments.

The multistage amplifier of FIG. 5 may provide high-gain and high-speed performance with low power consumption and low design complexity. Such an amplifier, and other amplifiers disclosed herein, may enable new low-power amplification applications not previously achievable. Embodiments of the differential amplifier 100, and the multistage amplifier 400, disclosed herein may be included in any suitable electronic device. For example, the differential amplifier 100 and the multistage amplifier 400 may be suitably included in an ADC. For example, FIG. 6 is a schematic illustration of a pipeline ADC 600 that may include the differential amplifier 100, in accordance with various embodiments. Various embodiments of the differential amplifier 100 may be included in one or more stages of a pipeline ADC. FIG. 6 depicts an embodiment of the pipeline ADC 600 having a plurality of pipeline stages 602, 604, and 606 connected in series. Although FIG. 6 depicts the pipeline ADC 600 having three pipeline stages, other pipeline ADCs containing the differential amplifier 100 may have any desired number of pipeline stages, with differing digital resolutions produced by each stage.

A first stage 602 may receive an analog input signal 608 to the pipeline ADC 600, and may generate a corresponding digital output 612, an analog residue 622, and an amplified analog residue 632. A second stage 604 may receive, as its analog input signal, the amplified analog residue 632 generated by the first stage 602 and may generate a corresponding digital output 614, an analog residue 624, and an amplified analog residue 634. A third stage 606 may receive, as its analog input, the amplified analog residue 634 generated by the previous stage 604 and may generate a corresponding digital output 616. The first stage 602 and the second stage 604 may be generally representative of non-final stages in the ADC 600, which may generate amplified analog residues to be passed to succeeding stages. The third stage 606 may be generally representative of a final stage of the ADC 600, and may produce no residue, as the overall analog input may have been fully converted to a digital representation after processing by the stages 602, 604, and 606.

Each of the non-final pipeline stages 602 and 604 can include an ADC (652 and 654, respectively), a digital to analog converter (DAC) (662 and 664, respectively), a subtraction circuit (672 and 674, respectively), and a residue amplifier (682 and 684, respectively). Within each stage, the ADC may receive an analog input to that stage and may convert the received analog input to a corresponding digital output. The ADC may have any suitable architecture, such as a flash, a switched-capacitor, or another ADC architecture. Within each stage, the DAC may receive the digital output generated by that stage and convert that digital output back to the analog domain to generate an additional analog output (indicated as 692 and 694 in the stages 602 and 604, respectively). Within each stage, the subtraction circuit may receive the analog input to the stage and the analog output generated by the DAC, and may generate an analog residue for that stage (622 and 624 for the stages 602 and 604, respectively) by subtracting the analog output from the DAC from the analog input to the stage. The residue amplifier (682 and 684 for the stages 602 and 604, respectively) may then amplify the analog residue to generate an amplified analog residue (632 and 634 for the stages 602 and 604, respectively) to pass to the next stage as its analog input. The final pipeline stage 606 can include an ADC 656 to convert a received analog input 646 to the corresponding digital output 616 and may not include a DAC, subtraction circuit, or residue amplifier. In some embodiments, each pipeline stage may have a closed-loop gain between 2 and 16, though other closed-loop gains may be used.

The pipeline ADC 600 may also include digital combination circuits 610 and 618 to combine the digital outputs generated by the pipeline stages to form an overall digital output 698 from the ADC 600. Each of the pipeline stages can generate the corresponding digital outputs (612, 614, and 616 for the stages 602, 604, and 606, respectively) having an associated digital resolution, and the digital outputs generated by each pipeline stage, starting with the first stage 602 and ending with the third stage 606, can represent successively less-significant portions of the overall digital output 698. The digital combination circuits 610 and 618 can eliminate any intentional redundancy between the individual digital outputs (612, 614, and 616) when generating the overall digital output 698.

Any suitable ones of the embodiments of the differential amplifier 100 disclosed herein may be included in any suitable portion of the ADC 600. For example, embodiments of the differential amplifier 100 may be used to implement any of the ADCs, DACs, subtraction circuits, and residue amplifiers of a pipeline stage. For example, a DAC included in a pipeline stage of an ADC may be a multiplying DAC (MDAC) and may include one or more of the differential amplifiers 100. In another example, a residue amplifier in a pipeline stage may include one or more of the differential amplifiers 100. Embodiments of the differential amplifiers 100 disclosed herein may be included in any op amp used in any suitable application, and not limited to ADCs or related technologies. In particular, various ones of the embodiments disclosed herein may be advantageously used in any amplification application requiring fast DC settlin, and lower supply voltages (relative to a high supply cascaded amplifier). The differential amplifier 100 and/or the multistage amplifier 400 may be packaged at any suitable level: individually, within a larger function-specific circuit (such as an ADC or DAC), within a multifunction integrated circuit (IC) package, within a wearable or embedded computing device, or within any suitable computing device, processing device, or analog electronic device.

Figure 7:
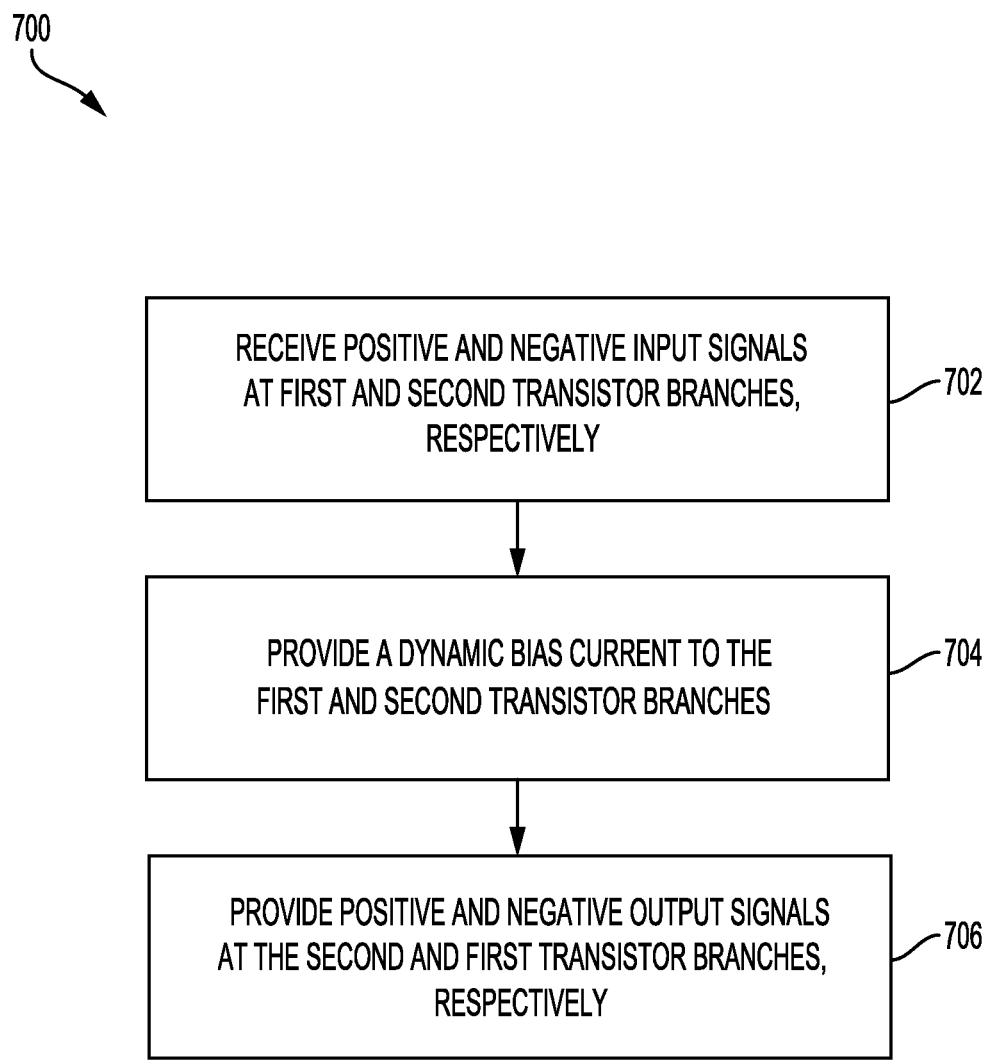
FIG. 7 is a flow diagram of a method of amplification with reduced slewing, in accordance with various embodiments.

FIG. 7 is a flow diagram of a method 700 of amplification with reduced slewing, in accordance with various embodiments. While the operations of the method 700 described herein are arranged in a particular order and illustrated once each, the operations of the method 700 may be performed substantially, simultaneously, or in response to each other, as suitable. Operations of the method 700 may be described as performed by the differential amplifier 100 (which may be included, e.g., in the multistage amplifier 400), but the operations of the method 700 may be performed by any suitably configured circuitry. Any of the operations of the method 700 may be performed in accordance with any of the embodiments of the differential amplifier 100 disclosed herein.

At 702, a differential amplifier may receive positive and negative input signals at first and second transistor branches, respectively. For example, the differential amplifier 100 may receive a positive input signal at the positive input terminal 120 of the first transistor branch 102 and a negative input signal at the negative input terminal 122 of the second transistor branch 104. In some embodiments, the positive and negative input signals may be generated by preceding amplification stages in a multistage amplifier (e.g., the multistage amplifier 400).

At 704, the differential amplifier may provide a dynamic bias current to the first and second transistor branches. For example, the current source 118 may contribute current to the first and second transistor branches, and the amount of the current may change as the positive and negative input signals change. In some embodiments, 704 may include providing a bias current through a replica transistor branch (e.g., the replica transistor branch 116) and maintaining, across the first and second transistor branches, a same voltage as measured across the replica transistor branch.

At 706, the differential amplifier may provide positive and negative output signals at the second and first transistor branches, respectively. For example, the differential amplifier 100 may provide a positive output signal at the positive output terminal 132 of the second transistor branch 104 and a negative output signal at the negative output terminal 130 of the first transistor branch 102. In embodiments where the differential amplifier 100 is an output stage of a multistage amplifier (e.g., the multistage amplifier 400), the positive and negative output signals provided at 706 may be the positive and negative output signals of the multistage amplifier.

The following paragraphs describe various examples of the embodiments disclosed herein.

Example is a differential amplifier for improved slew performance, including: parallel first and second transistor branches coupled between a first node and a second node; regulator circuitry to receive a reference voltage value at a regulator input and maintain the reference voltage value at a regulator output, wherein the regulator output is coupled to the first node; and a replica transistor branch coupled between the regulator input and the second node, wherein the replica transistor branch includes an arrangement of transistors that replicates an arrangement of transistors in the first transistor branch; wherein a current source is coupled to the regulator input to provide current to the regulator circuitry, the first and second transistor branches, and the replica transistor branch.

Example 2 may include the subject matter of Example 1, and may further specify that the regulator circuitry comprises a supply transistor coupled between a supply voltage and the regulator output.

Example 3 may include the subject matter of Example 2, and may further specify that the regulator circuitry comprises an operational amplifier having first and second inputs and an output, and the output of the operational amplifier coupled to a gate of the supply transistor.

Example 4 may include the subject matter of Example 3, and may further specify that the first input of the operational amplifier is coupled to the regulator input.

Example 5 may include the subject matter of any of Examples 3-4, and may further specify that the second input of the operational amplifier is coupled to the regulator output.

Example 6 may include the subject matter of any of Examples 2-5, and may further specify that a drain of the supply transistor is coupled to the supply voltage and a source of the supply transistor is coupled to the regulator output.

Example 7 may include the subject matter of any of Examples 1-6, and may further specify that the first transistor branch comprises a PMOS transistor and an NMOS transistor, and a gate of the PMOS transistor is coupled to a gate of the NMOS transistor.

Example 8 may include the subject matter of Example 7, and may further specify that a drain of the PMOS transistor is coupled to a drain of the NMOS transistor.

Example 9 may include the subject matter of Example 8, and may further specify that the gate of the PMOS transistor is coupled to a positive input terminal of the differential amplifier and the drain of the PMOS transistor is coupled to a negative output terminal of the differential amplifier.

Example 10 may include the subject matter of any of Examples 7-10, and may further specify that the second transistor branch includes a same arrangement of transistors as included in the first transistor branch, the gate of the PMOS transistor of the second transistor branch is coupled to a negative input terminal of the differential amplifier, and a drain of the PMOS transistor of the second transistor branch is coupled to a positive output terminal of the differential amplifier.

Example 11 may include the subject matter of any of Examples 1-10, and may further specify that the replica transistor branch comprises a PMOS transistor and an NMOS transistor, a drain of the PMOS transistor coupled to a drain and a gate of the NMOS transistor, and a gate of the PMOS transistor coupled to the drain and the gate of the NMOS transistor.

Example 12 may include the subject matter of any of Examples 1-11, and may further specify that the differential amplifier is an output stage of a multistage amplifier.

Example 13 may include the subject matter of Example 12, and may further specify that the multistage amplifier is a three-stage amplifier, and positive and negative output terminals of the differential amplifier are coupled to negative and positive input terminals, respectively, of a second stage via compensation capacitors.

Example 14 is a differential amplifier for improved slew performance, including: first differential amplification means; second differential amplification means following the first differential amplification means; third differential amplification means, following the second differential amplification means, comprising parallel first and second transistor branches coupled between a first node and a second node, means for receiving a reference voltage value at a third node and maintaining the reference voltage value at the first node, and a replica transistor branch coupled between the third node and the second node, wherein a current source is coupled to the third node; first compensation means coupled between a positive output of the third differential amplification means and a positive input of the second differential amplification means; and second compensation means coupled between a negative output of the third differential amplification means and a negative input of the second differential amplification means.

Example 15 may include the subject matter of Example 14, and may further specify that the first differential amplification means has a cascode configuration.

Example 16 may include the subject matter of any of Examples 14-15, and may further specify that the reference voltage value is approximately 1.2 volts.

Example 17 may include the subject matter of any of Examples 14-16, and may further specify that the differential amplifier is included in an analog to digital converter (ADC) package.

Example 18 is a method of amplification with reduced slewing, including: receiving positive and negative input signals at first and second transistor branches, respectively, of a differential amplification stage; providing a dynamic bias current to the first and second transistor branches, wherein the bias current changes in response to the positive and negative input signals; and providing positive and negative output signals at the second and first transistor branches, respectively.

Example 19 may include the subject matter of Example 18, and may further include providing a supply voltage, wherein a value of the supply voltage is less than a voltage drop across the first transistor branch.

Example 20 may include the subject matter of any of Examples 18-19, and may further specify that providing the dynamic bias current includes: providing a bias current through a replica transistor branch, wherein the replica transistor branch includes an arrangement of transistors that replicates an arrangement of transistors in the first transistor branch; and maintaining, across the first and second transistor branches, a same voltage as measured across the replica transistor branch.

Example 21 is an amplifier comprising means for performing the method of any of Examples 18-20.

What is claimed is:

1. A differential amplifier for improved slew performance, comprising:
    parallel first and second transistor branches coupled between a first node and a second node;
    regulator circuitry to receive a reference voltage value at a regulator input and maintain the reference voltage value at a regulator output, wherein the regulator output is coupled to the first node; and
    a replica transistor branch coupled between the regulator input and the second node, wherein the replica transistor branch includes an arrangement of transistors that replicates an arrangement of transistors in the first transistor branch;
    wherein a current source is coupled to the regulator input to provide current to the regulator circuitry, the first and second transistor branches, and the replica transistor branch.

2. The differential amplifier of claim 1, wherein the regulator circuitry comprises a supply transistor coupled between a supply voltage and the regulator output.

3. The differential amplifier of claim 2, wherein the regulator circuitry comprises an operational amplifier having first and second inputs and an output, and the output of the operational amplifier coupled to a gate of the supply transistor.

4. The differential amplifier of claim 3, wherein the first input of the operational amplifier is coupled to the regulator input.

5. The differential amplifier of claim 3, wherein the second input of the operational amplifier is coupled to the regulator output.

6. The differential amplifier of claim 2, wherein a drain of the supply transistor is coupled to the supply voltage and a source of the supply transistor is coupled to the regulator output.

7. The differential amplifier of claim 1, wherein the first transistor branch comprises a PMOS transistor and an NMOS transistor, and a gate of the PMOS transistor is coupled to a gate of the NMOS transistor.

8. The differential amplifier of claim 7, wherein a drain of the PMOS transistor is coupled to a drain of the NMOS transistor.

9. The differential amplifier of claim 8, wherein the gate of the PMOS transistor is coupled to a positive input terminal of the differential amplifier and the drain of the PMOS transistor is coupled to a negative output terminal of the differential amplifier.

10. The differential amplifier of claim 7, wherein the second transistor branch includes a same arrangement of transistors as included in the first transistor branch, the gate of the PMOS transistor of the second transistor branch is coupled to a negative input terminal of the differential amplifier, and a drain of the PMOS transistor of the second transistor branch is coupled to a positive output terminal of the differential amplifier.

11. The differential amplifier of claim 1, wherein the replica transistor branch comprises a PMOS transistor and an NMOS transistor, a drain of the PMOS transistor coupled to a drain and a gate of the NMOS transistor, and a gate of the PMOS transistor coupled to the drain and the gate of the NMOS transistor.

12. The differential amplifier of claim 1, wherein the differential amplifier is an output stage of a multistage amplifier.

13. The differential amplifier of claim 12, wherein the multistage amplifier is a three-stage amplifier, and positive and negative output terminals of the differential amplifier are coupled to negative and positive input terminals, respectively, of a second stage via compensation capacitors.

14. A differential amplifier for improved slew performance, comprising:
    first differential amplification means;
    second differential amplification means following the first differential amplification means;
    third differential amplification means, following the second differential amplification means, comprising parallel first and second transistor branches coupled between a first node and a second node, means for receiving a reference voltage value at a third node and maintaining the reference voltage value at the first node, and a replica transistor branch coupled between the third node and the second node, wherein a current source is coupled to the third node, and wherein the replica transistor branch includes an arrangement of transistors that replicates an arrangement of transistors in the first transistor branch;
    first compensation means coupled between a positive output of the third differential amplification means and a positive input of the second differential amplification means; and
    second compensation means coupled between a negative output of the third differential amplification means and a negative input of the second differential amplification means.

15. The differential amplifier of claim 14, wherein the first differential amplification means has a cascode configuration.

16. The differential amplifier of claim 14, wherein the reference voltage value is approximately 1.2 volts.

17. The differential amplifier of claim 14, wherein the differential amplifier is included in an analog to digital converter (ADC) package.

18. A method of amplification with reduced slewing, comprising:
    receiving positive and negative input signals at first and second transistor branches, respectively, of a differential amplification stage;
    providing a supply voltage, wherein a value of the supply voltage is less than a voltage drop across the first transistor branch;
    providing a dynamic bias current to the first and second transistor branches, wherein the bias current changes in response to the positive and negative input signals; and
    providing positive and negative output signals at the second and first transistor branches, respectively.

19. The method of claim 18, wherein providing the dynamic bias current comprises:
    providing a bias current through a replica transistor branch, wherein the replica transistor branch includes an arrangement of transistors that replicates an arrangement of transistors in the first transistor branch; and
    maintaining, across the first and second transistor branches, a same voltage as measured across the replica transistor branch.

20. The method of claim 18, wherein the differential amplification stage is included in an analog to digital converter (ADC) package.

* * * * *